US009275942B2

(12) United States Patent
Koczwara et al.

(10) Patent No.: US 9,275,942 B2
(45) Date of Patent: Mar. 1, 2016

(54) FLEXIBLE LEAD FRAME CONNECTION FOR ELECTRONIC INTERCONNECTS

(71) Applicant: Continental Automotive Systems, Inc., Auburn Hills, MI (US)

(72) Inventors: Lukasz Koczwara, Bloomingdale, IL (US); Donald J Zito, Fox River Grove, IL (US); James D Baer, Gurnee, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 14/550,211

(22) Filed: Nov. 21, 2014

(65) Prior Publication Data
US 2015/0194371 A1   Jul. 9, 2015

Related U.S. Application Data

(60) Provisional application No. 61/924,885, filed on Jan. 8, 2014.

(51) Int. Cl.
*H01L 23/495* (2006.01)
*H01L 23/498* (2006.01)

(52) U.S. Cl.
CPC ...... *H01L 23/49537* (2013.01); *H01L 23/4985* (2013.01); *H01L 23/49833* (2013.01); *H01L 23/49838* (2013.01); *H01L 2924/0002* (2013.01)

(58) Field of Classification Search
CPC ............ H01L 23/49537; H01L 23/49833; H01L 23/49838; H01L 23/4985; H01L 23/0002
See application file for complete search history.

(56) References Cited

U.S. PATENT DOCUMENTS

| 5,519,596 | A | 5/1996 | Woolverton |
| 6,936,855 | B1 | 8/2005 | Harrah |
| 2004/0207998 | A1* | 10/2004 | Suehiro et al. ................. 362/84 |
| 2007/0040283 | A1* | 2/2007 | Fauty .................... H01L 21/561 257/782 |

* cited by examiner

*Primary Examiner* — Jerome Jackson, Jr.
*Assistant Examiner* — Wasiul Haider

(57) ABSTRACT

A lead frame assembly which allows for the connection of multiple individual fixed components in various locations, while alleviating tolerance concerns by having a flexible lead frame. The lead frame assembly includes several sub-lead frames, and a plurality of interconnects which connect each of the sub-lead frames together. The lead frame assembly also includes a plurality of segments, and each segment surrounds one of the sub-lead frames, to electrically isolate each sub-lead frame. Various components are electrically connected by incorporating stamped receptacles, or slot terminals, in the sub-lead frames. The interconnects along with plastic voids allow the various attached components to have tolerance flexibility relative to one another, as various components are attached to each of the slot terminals.

17 Claims, 6 Drawing Sheets

FLEXIBLE LEAD FRAME CONNECTION FOR ELECTRONIC INTERCONNECTS

CROSS-REFERENCE TO RELATED APPLICATIONS

This application claims the benefit of U.S. Provisional Application No. 61/924,885 filed Jan. 8, 2014. The disclosure of the above application is incorporated herein by reference.

FIELD OF THE INVENTION

The invention relates generally to a lead frame assembly which has more than one flexible interconnect used to provide a flexible connection between various sub-lead frames, compensating for tolerance variations in components connected to the lead frame assembly.

BACKGROUND OF THE INVENTION

Lead frames are commonly used to provide connection between various electrical components. Typical lead frames are rigid overmolded structures that are assembled with other components during an assembly process. Because the lead frames are rigid, there is very little adjustment available, and therefore little allowance for flexibility of component location tolerances. These tolerances may vary as a result of dimensional fluctuations which occur during the manufacturing process, or from exposure to different temperatures, where the lead frame, overmolding, and components connected to the lead frame have different coefficients of thermal expansion, leading to inconsistent dimensional fluctuations during thermal cycling. Some components, due to the nature of their construction, may require more flexibility with regard to positioning relative to the lead frame, ensuring a proper connection with minimal stress on the lead frame.

Accordingly, there exists a need for a lead frame which provides suitable connection between various electrical components, and allows for flexibility of component location tolerances which may occur during the manufacturing process, or from exposure to thermal cycling.

SUMMARY OF THE INVENTION

The present invention is a lead frame assembly which allows for the connection of multiple individual fixed components in various locations, while alleviating tolerance concerns by having a flexible lead frame. Various components are electrically connected by incorporating stamped receptacles, or slot terminals, in the lead frame. Interconnects along with plastic voids allow the various attached components to have flexibility relative to one another after shipping carrier strips are removed.

In one embodiment, the lead frame assembly of the present invention includes several sub-lead frames, and a plurality of interconnects which connect each of the sub-lead frames together. The interconnects allow for movement in multiple directions of the sub-lead frames relative to one another.

Each of the interconnects includes a first arc portion connected to one of the sub-lead frames, a second arc portion connected to the first arc portion, and a third arc portion connected to the second arc portion and another of the sub-lead frames. The first arc portion, second arc portion, and third arc portion deflect to allow for relative movement between two or more of the sub-lead frames.

The lead frame assembly includes a plurality of segments, and each segment surrounds one of the sub-lead frames, through a process such as overmolding, and functions as a housing. There is also a plurality of terminals, and each of the terminals is connected to one of the sub-lead frames. While each segment substantially surrounds a corresponding sub-lead frame, the interconnects and the terminals are still exposed, and not surrounded by the segments. In one embodiment, the terminals are M-slot terminals, and electrical components are connected to the M-slot terminals.

In one embodiment, there are seven sub-lead frames connected in series, and seven segments. A first sub-lead frame is connected to a second sub-lead frame, the second sub-lead frame is connected to a third sub-lead frame, a fourth sub-lead frame connected to the third sub-lead frame, a fifth sub-lead frame is connected to the fourth sub-lead frame, a sixth sub-lead frame connected to the fifth sub-lead frame, and a seventh sub-lead frame is connected to the sixth sub-lead frame. The connection of each of the sub-lead frames together using the interconnects allows for each sub-lead frame to move transversely relative to one another, depending upon the configuration of the interconnects.

The sub-lead frames are connected to each other using different amounts of interconnects in different configurations. In one embodiment, there are three interconnects connecting one of the sub-lead frames to another of the sub-lead frames, and the three interconnects are configured such that one of the interconnects is offset from the other two interconnects. The interconnects also may be configured such that more or less interconnects are used to connect two of the sub-lead frames together, and are either aligned or offset from one another.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

A diagram of a lead frame assembly according to the present invention is shown in the Figures generally at 10. The lead frame assembly 10 includes sub-lead frames, shown generally at 10A-10G, respectively, which are connected together by a plurality of interconnects 14a1-14f4. Each sub-lead frame 10A-10G has a corresponding segment 12a-12g, each of which functions as a housing for each of the sub-lead frames 10A-10G. The segments 12a-12g are made of a plastic material, but it is within the scope of the invention that other types of materials may be used.

Figure 5:
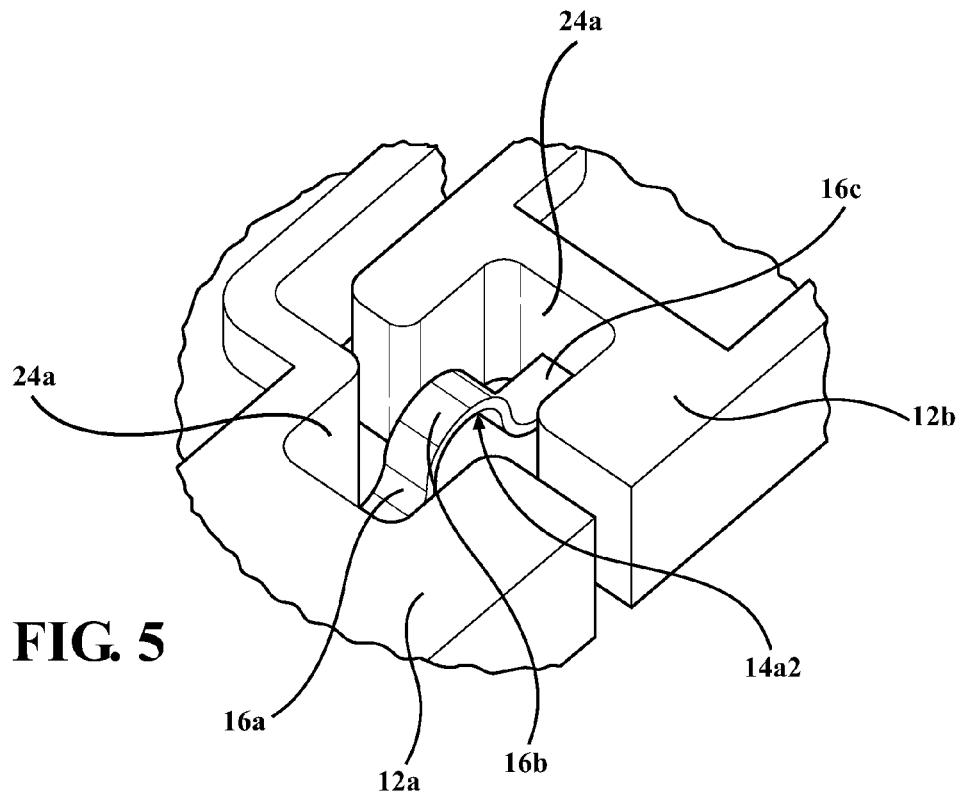
FIG. 5 is an enlarged view of the circled portion shown in FIG. 4
Figure 6:
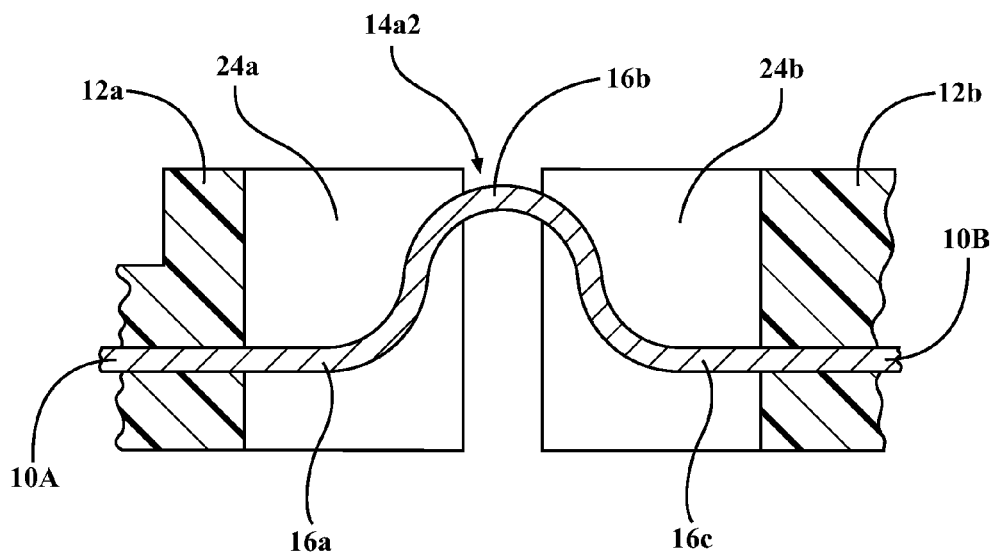
FIG. 6 an enlarged view of a flexible interconnect, used with a lead frame assembly, according to the present invention.

Each interconnect 14a1-14f4 includes a plurality of arc portions, shown in FIGS. 5-6. An example of one of the interconnects 14a1 is shown in FIG. 6, where the interconnect 14a1 is used to connect part of the first sub-lead frame 10A to part of the second sub-lead frame 10B. However, the other interconnects 14a2-14f4 are constructed and connected to the sub-lead frames 10A-10G in a similar manner. The interconnect 14a1 includes a first arc portion 16a connected to a second arc portion 16b, and the second arc portion 16b is connected to a third arc portion 16c. The first arc portion 16a is also connected to and formed as part of the first sub-lead frame 10A, and the third arc portion 16b is also connected to and formed as part of the second sub-lead frame 10B. Portions of the segments 12a-12g may be overmolded onto the respective sub-lead frames 10A-10G, but it is within the scope of the invention that the segments 12a-12g may be connected to the sub-lead frames 10A-10G in other ways.

Figure 1:
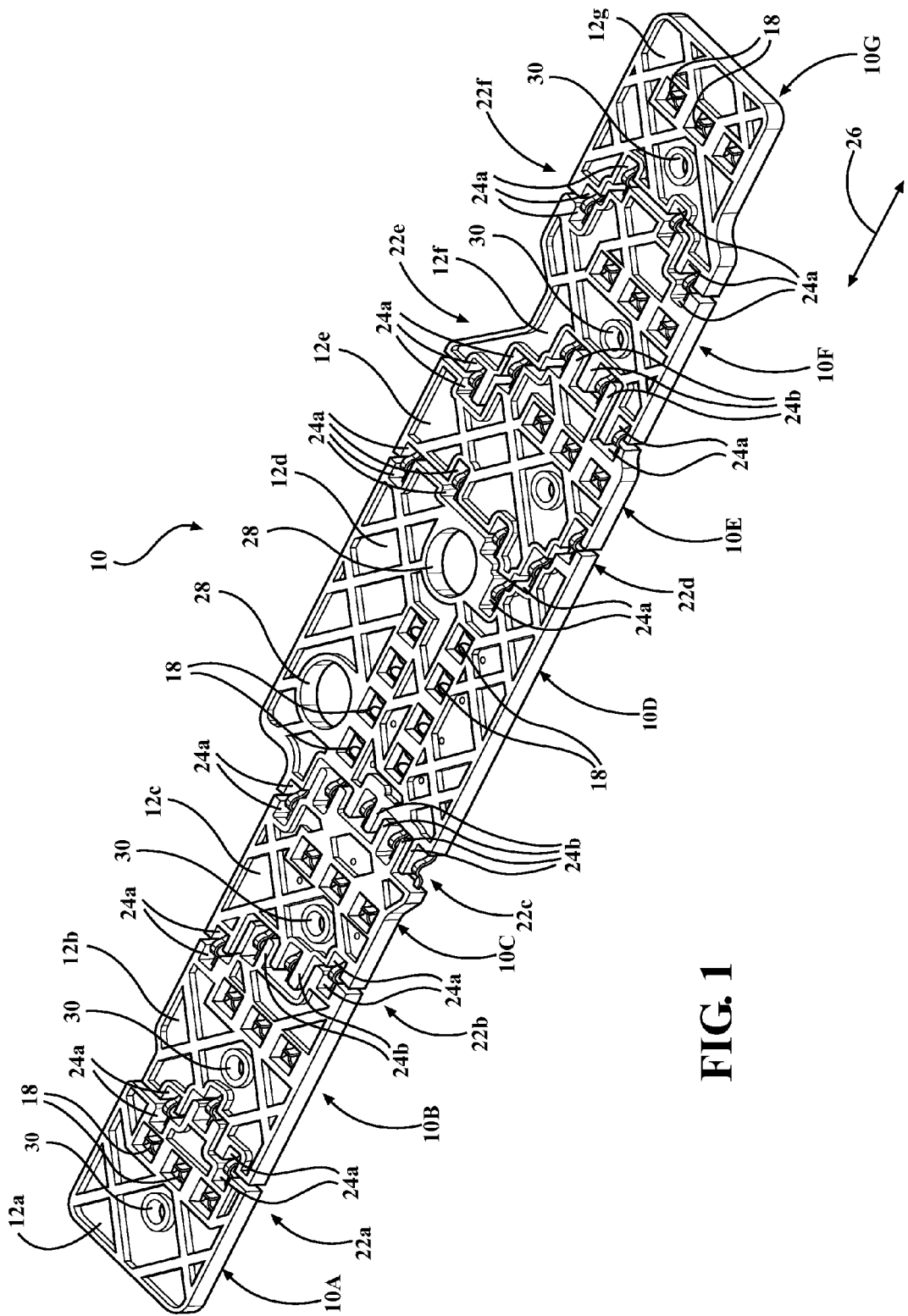
FIG. 1 is a perspective view of a lead frame assembly having at least one flexible interconnect, according to embodiments of the present invention.
Figure 2:
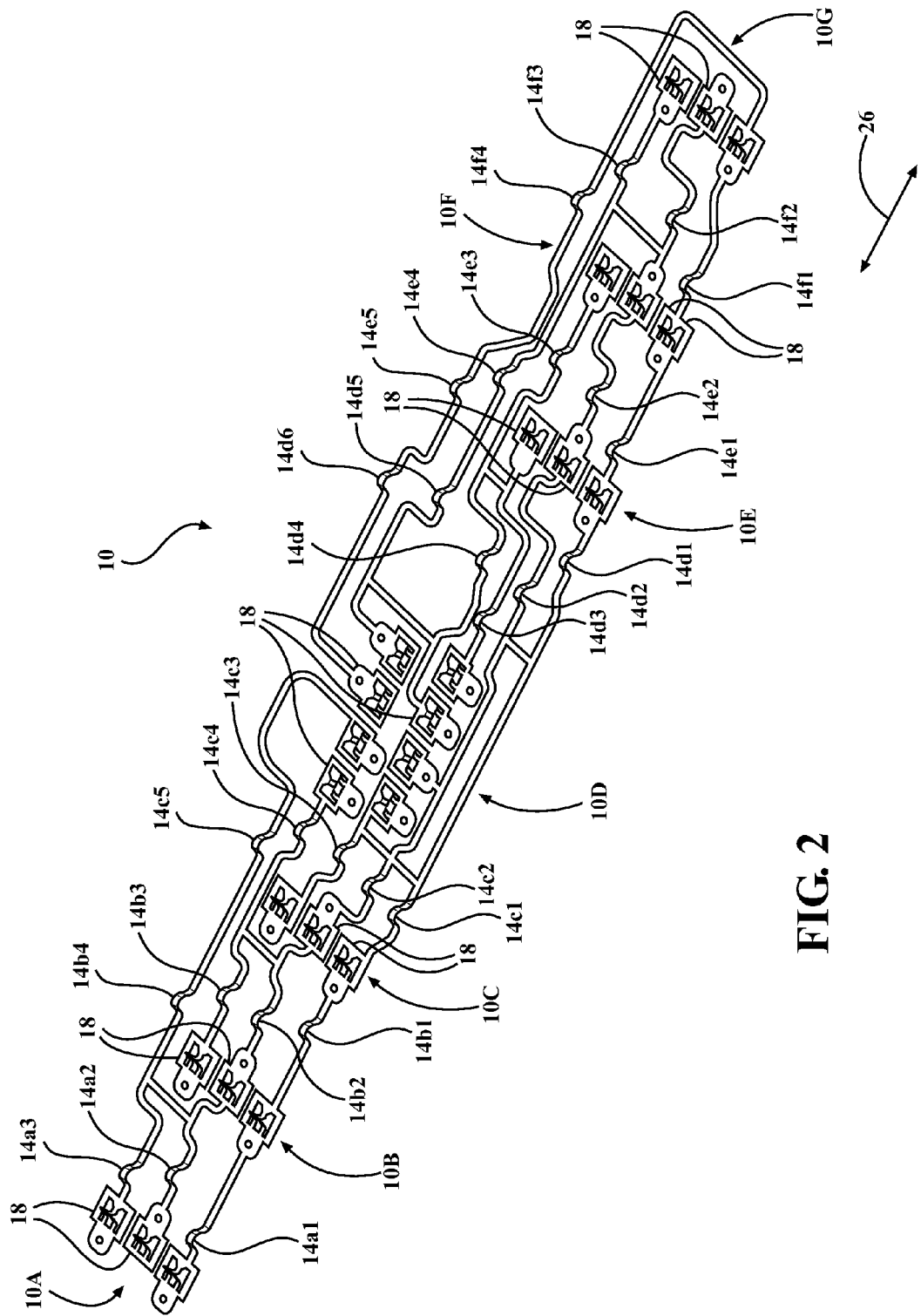
FIG. 2 is a perspective view of a lead frame assembly having at least one flexible interconnect, with the segments removed, according to embodiments to the present invention.
Figure 3:
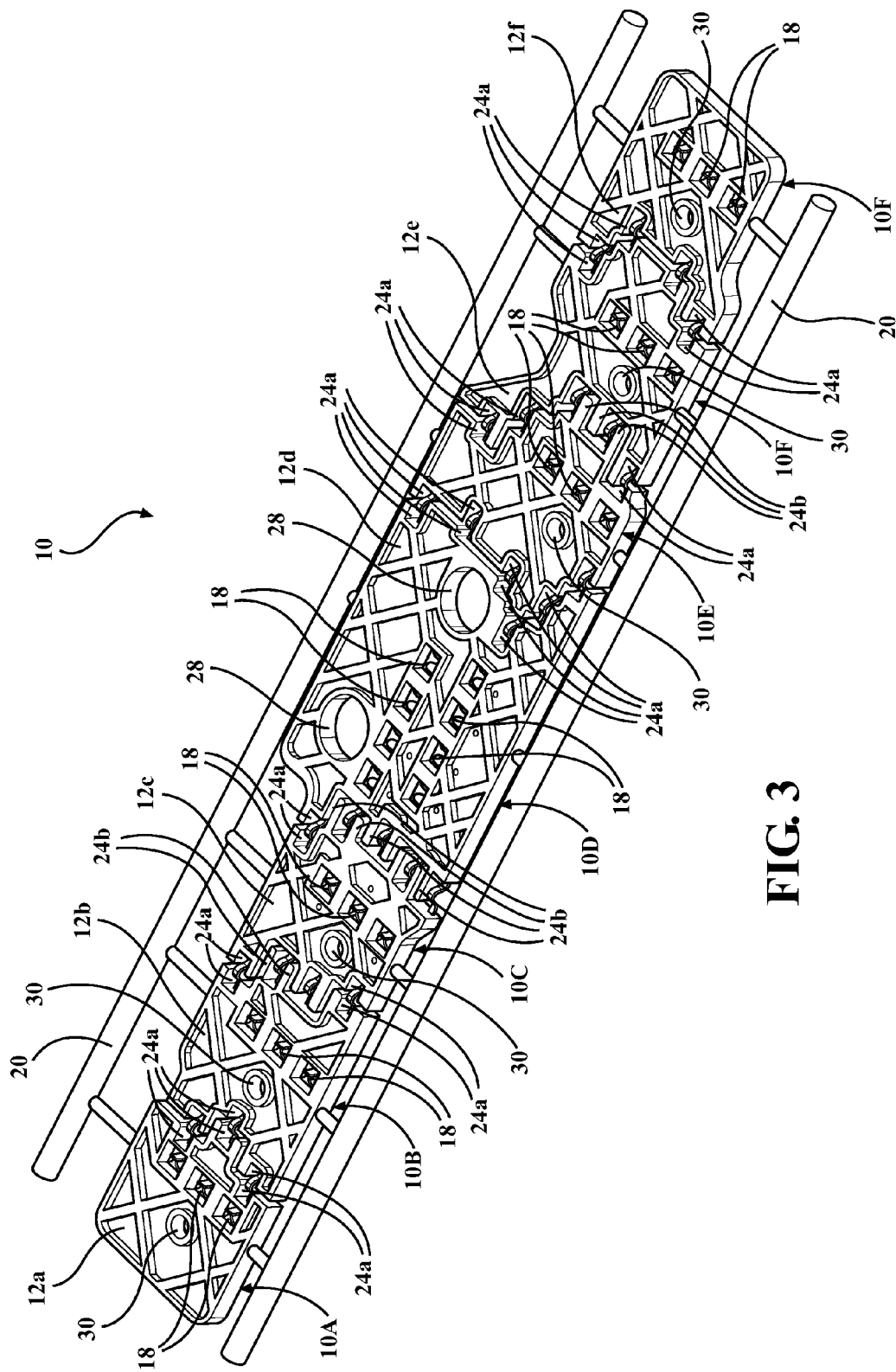
FIG. 3 is a perspective view of a lead frame assembly having at least one flexible interconnect, with the carrier brackets attached, according to embodiments of the present invention.
Figure 4:
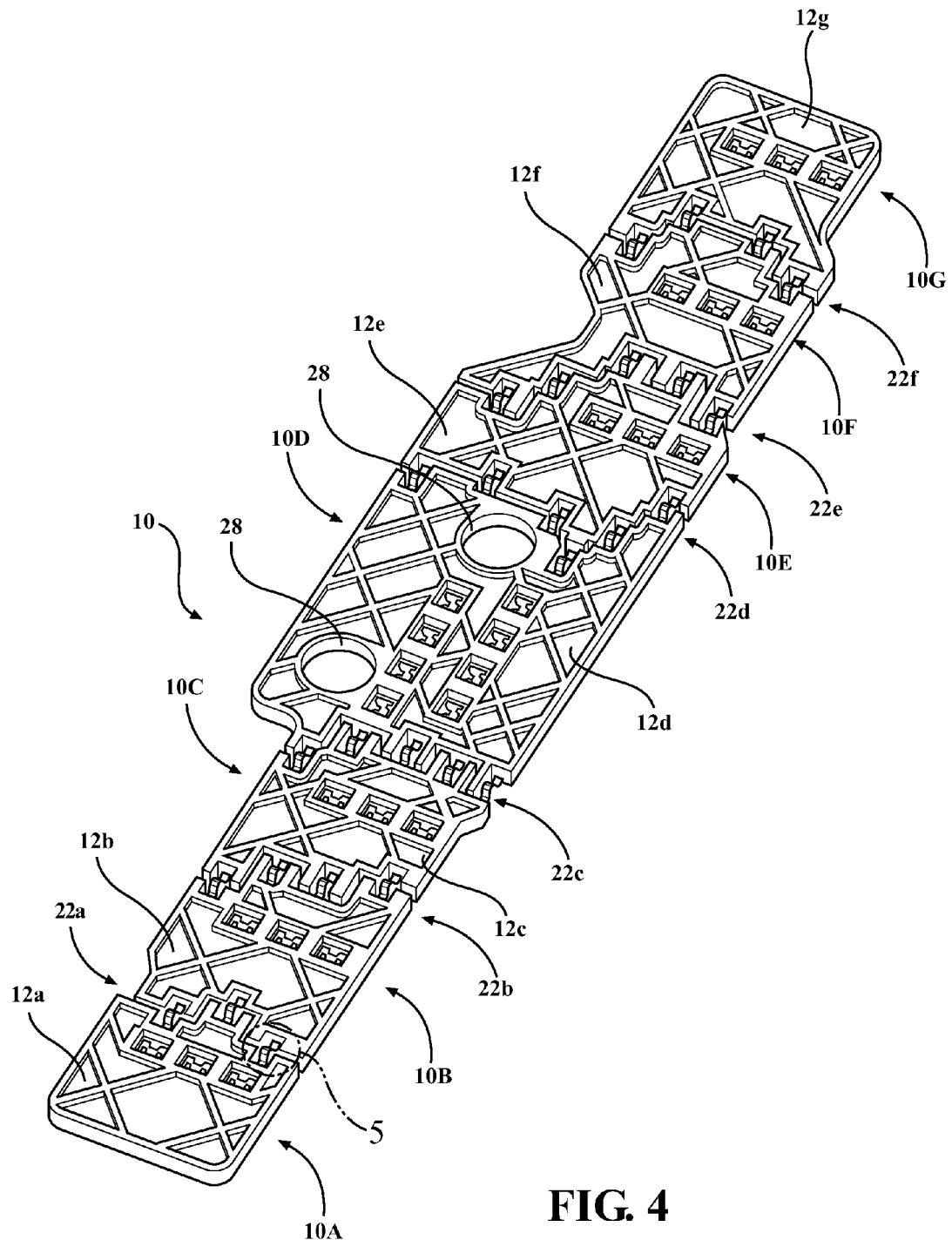
FIG. 4 is a second perspective view of a lead frame assembly having at least one flexible interconnect, according to embodiments of the present invention.

Each sub-lead frame 10A-10G includes a plurality of slot terminals, which in this embodiment are M-slot terminals 18, which are integrally formed with the sub-lead frames 10A-10G. While it has been mentioned that the segments 12a-12g may be overmolded around the sub-lead frames 10A-10G, the segments 12a-12g do not surround the M-slot terminals 18 (to allow components to connect to the M-slot terminals 18) or the interconnects 14a1-14f4 (to allow the interconnects 14a1-14f4 to deflect). Various electrical components are connected to the M-slot terminals 18, such as solenoids, semi-conductor chips, pressure sensors, and the like. More specifically, as shown in FIG. 2, the lead frame assembly 10 is shown with the segments 12a-12g removed, and the lead fame assembly 10 has the plurality of sub-lead frames 10A-10G, where each of the sub-lead frames 10A-10G has one or more of the M-slot terminals 18. Each of the sub-lead frames 10A-10G are connected to one another using the interconnects 14a1-14f4, therefore placing the M-slot terminals 18 in electrical communication with one another. Various components may be connected to one or more of the M-slot terminals 18, and, depending on the configuration of the M-slot terminals 18 and the sub-lead frames 10A-10G, the M-slot terminals 18 may be in communication one or more of the other M-slot terminals 18 connected to the different sub-lead frames 10A-10G.

The interconnects 14a1-14f4 are also in varying locations throughout the different sub-lead frames 10A-10G. Some of the interconnects 14a1-14f4 are aligned with one another as well. Because the interconnects 14a1-14f4 are not overmolded and protected by the segments 12a-12g, the interconnects 14a1-14f4 are exposed. The interconnects 14a1-14f4 are separated by isolation features 24a,b formed as part of the segments 12a-12g, and configured in the manner shown in the Figures to prevent shorting between the interconnects 14a1-14f4. There are two types of isolation features 24a,b, there are recesses 24a formed as part of the segments 12a-12g, as well as wall portions 24b formed as part of the segments 12a-12g. If the lead frame assembly 10 is used as part of a transmission, there are instances where the lead frame assembly 10 may be exposed to pieces of metal, or "slivers," in the transmission. These metal slivers contacting two or more of the interconnects 14a1-14f4 may cause electrical shorting between the interconnects 14a1-14f4. The isolation features 24a,24b electrically isolate the interconnects 14a1-14f4 from one another, preventing electrical shorting by limiting occurrence of a metal sliver coming in contact with more than one interconnect 14a1-14f4.

In one embodiment, the sub-lead frames 10A-10G and the different segments 12a-12g are shaped differently, such that the segments 12a-12g are overmolded around the sub-lead frames 10A-10G, but not the interconnects 14a1-14f4, as described above. The interconnects 14a1-14f4 are configured in groups to provide a flexible connection between each of the sub-lead frames 10A-10G. More specifically, there are joints, shown generally at 22a-22f, made up of varying amounts of interconnects 14a1-14f4, which provide the connection between the various sub-lead frames 10A-10G. The position and amount of interconnects 14a1-14f4 used to connect the various sub-lead frames 10A-10G affects how much the sub-lead frames 10A-10G may move transversely relative to one another, as indicated by arrows 26.

The first joint, shown generally at 22a, connects the first two sub-lead frames 10A,10B, the second joint, shown generally at 22b, connects the second and third sub-lead frames 10B,10C, the third joint, shown generally at 22c, connects the third and fourth sub-lead frames 10C,10D, the fourth joint, shown generally at 22d, connects the fourth and fifth sub-lead frames 10D,10E, the fifth joint, shown generally at 22e, connects the fifth and sixth sub-lead frames 10E,10F, and the sixth joint, shown generally at 22f, connects the sixth and seventh sub-lead frames 10F,10G.

The first joint 22a has the first interconnect 14a1, a second interconnect 14a2, and a third interconnect 14a3, where the first interconnect 14a1 and the third interconnect 14a3 are in substantial alignment with one another, and the second interconnect 14a2 is offset from the first interconnect 14a1 and the third interconnect 14a3. The interconnects 14a1-14a3 are configured such that the interconnects 14a1,14a3 are offset from the second interconnect 14a2, and are also surrounded by recesses 20a formed as part of the segments 12a,12b to electrically isolate the interconnects 14a1-14a3 from one another, as shown in FIGS. 1 and 3-5, to prevent shorting. The interconnects 14a1-14a3 allow the first sub-lead frame 10A and second sub-lead frame 10B to move transversely relative to one another in the direction of the arrows indicated at 26.

The second joint 22b includes four interconnects 14b1, 14b2, 14b3, 14b4. The interconnects 14b2 and 14b3 are in substantial alignment with one another, and the interconnects 14b1 and 14b4 are offset from one another and the interconnects 14b2 and 14b3. This allows the second sub-lead frame 10B and third sub-lead frame 10C to move transversely relative to one another in the direction of the arrows indicated at 26. The interconnects 14b1 and 14b4 are partially disposed in recesses 24a formed as part of the second and third segments 12b,12c, and the other interconnects 14b2 and 14b3 of the second joint 22b are adjacent various wall portions 24b formed as part of the second and third segments 12b,12c. The recesses 24a and wall portions 24b electrically isolate the interconnects 14b1-14b4 from one another, to prevent electrical shorting.

The third joint 22c connects the third sub-lead frame 10C and the fourth sub-lead frame 10D. The third joint 22c includes five interconnects 14c1-14c5, and the first four interconnects 14c1-14c4 of the third joint 22c are adjacent various wall portions 24b formed as part of the third and fourth segments 12c,12d, and the last interconnect 14c5 is partially surrounded by recesses 24a formed as part of the third and fourth segments 12c,12d, to prevent electrical shorting between the interconnects 14c1-14c5. The interconnects 14c1-14c5 allows the third sub-lead frame 12c and the fourth sub-lead frame 12d to move transversely relative to one another in the direction of the arrows 26.

The fourth joint 22d allows for relative transverse movement between the fourth sub-lead frame 10D and the fifth sub-lead frame 10E, as indicated by the arrows 26. The fourth joint 22d includes six interconnects 14d1,14d2,14d3,14d4, 14d5,14d6, where the interconnects 14d2,14d4,14d6 are in alignment with one another, and the remaining interconnects 14d1,14d3,14d5 are offset from one another, and from the interconnects 14d2,14d4,14d6. Each of the interconnects 14d1-14d6 are partially surrounded by recesses 24a of various shapes formed as part of the fourth segment and fifth segment 12d,12e, to electrically isolate the interconnects 14d1-14d6 from one another, to prevent electrical shorting.

The fifth joint 22e includes five interconnects 14e1, 14e2, 14e3, 14e4, 14e5. The second and third interconnects 14e2, 14e3 are in substantial alignment with one another, and the first interconnect 14e1, fourth interconnect 14e4, and fifth interconnect 14e5 of the fifth joint 22e are offset from one another and the second and third interconnects 14e2, 14e3. This allows the fifth sub-lead frame 10E and the sixth sub-lead frame 10F to move transversely relative to one another in the direction of the arrows 26. The first interconnect 14e1, fourth interconnect 14e4, and fifth interconnect 14e5 of the fifth joint 22e are at least partially surrounded by recesses 24a formed as part of the fifth segment 12e and the sixth segment 12f, and the second interconnect 14e2 and third interconnect 14e3 are surrounded by wall portions 24b formed as part of fifth segment 12e and the sixth segment 12f, which prevents electrical shorting between the interconnects 14e1-14e5.

The sixth joint 22f includes four interconnects 14f1,14f2, 14f3,14f4, which connect the sixth sub-lead frame 10F and the seventh sub-lead frame 10O. The second and third interconnects 14f2,14f3 of the sixth joint 22f are in substantial alignment with one another, and the first and fourth interconnects 14f1,14f4 are offset from one another, and are offset from the second and third interconnects 14f2,14f3. The interconnects 14f1-14f4 allow for the sixth sub-lead frame 10F and the seventh sub-lead frame 10O to move transversely relative to one another in the direction of the arrows 26. Also, each of the interconnects 14f1-14f5 of the sixth joint are partially disposed in recesses 24a of various shapes formed as part of the sixth segment 12g and the seventh segment 12g.

While it has been shown that some of the interconnects 14a1-14f4 are offset from one another, and others are not, it is within the scope of the invention that the configuration of the various joints 22a-22e may be changed to have different interconnects 14a1-14f4 offset from one another in a different configuration other than was is described above, to allow the different sub-lead frames 10A-10G to move differently than what is shown in the Figures, and allow for the M-slot terminals 18 to be configured differently, making the lead frame assembly 10 suitable for different applications.

In this embodiment, the lead frame assembly 10 is connected to a main lead frame and various sensors, where the sensors have fixed positions. The main lead frame may be part of a transmission control unit (TCU) or the like. The fourth sub-lead frame 10D is the largest of the sub-lead frames 10A-10G, and includes eight M-slot terminals 18, which are in electrical communication with the M-slot terminals 18 of the other sub-lead frames 10A-10C and 10E-10G. The fourth segment 12d overmolded around the fourth sub-lead frame 10D includes two mounting apertures 28, which are used to connect the fourth segment 12d and fourth sub-lead frame 10D to the main lead frame of the TCU. The connection between the main lead frame and the mounting apertures 28 may be a snap-fit connection, or the like.

Figure 7:
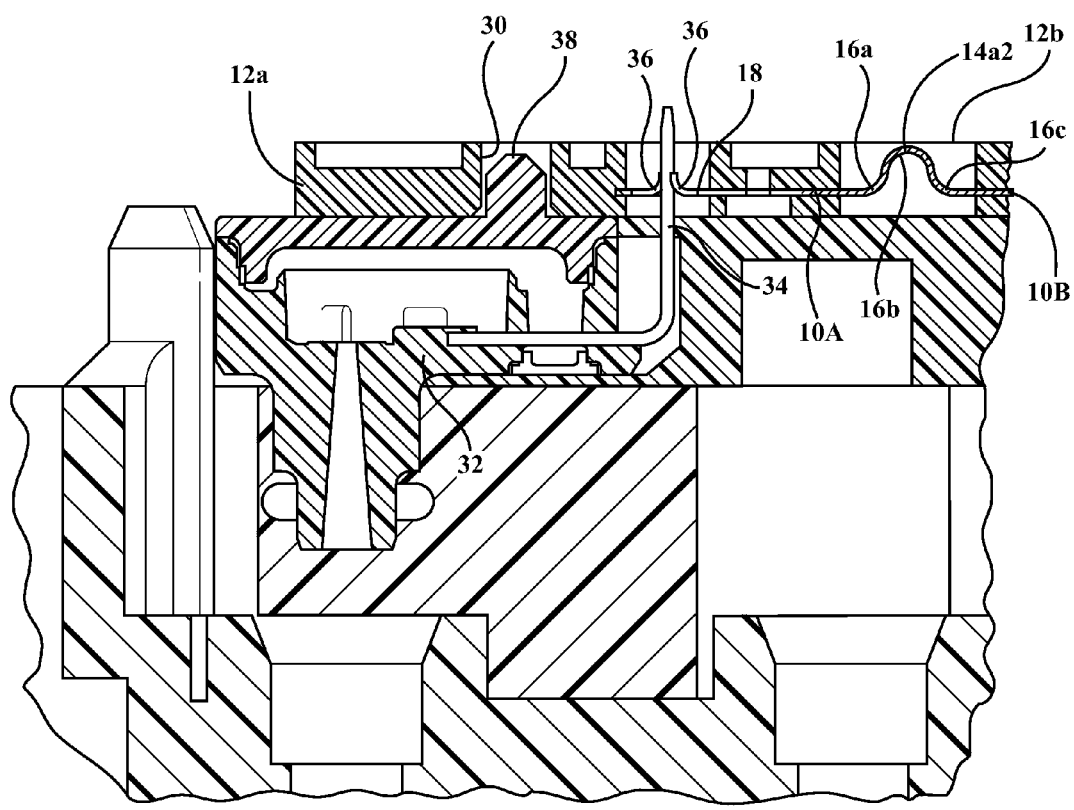
FIG. 7 is s sectional side view of part of a pressure sensor and a lead frame assembly connected together, according to embodiments of the present invention.

Referring to FIGS. 1, 3-4, and 7, each of the segments 12a-12c and 12e-12g also include alignment apertures 30, which are smaller than the mounting apertures 28 formed as part of the fourth segment 12d. In one embodiment, each of the remaining segments 12a-12c and 12e-12g is connected to a pressure sensor 32 having the connector pins 34, an example of which is shown in FIG. 7. The alignment apertures 30 provide proper alignment so the connector pins 34 may be properly inserted through the M-slot terminals 18, as shown in FIG. 7. The pressure sensor 32 includes an alignment post 38, which extends into the alignment aperture 30 of the first segment 12a, as shown in FIG. 7, when the lead frame assembly 10 is connected to the main lead frame of the TCU.

Each of the M-slot terminals 18 include a plurality of tabs, which in this embodiment are three tabs 36, which are curved in a first direction, or upwardly as shown in FIGS. 1-4 and 7. It is also shown that the tabs 36 are configured such that two of the tabs 36 apply force to a first side of the connector pin 34, and another of the tabs 36 applies force to a second side of the connector pin 34. The pin 34 receiving force from the tabs 36 on both sides of the pin 34 stabilizes the pin 34, and ensures the pin 34 remains in electrical communication with the corresponding M-slot terminal 18, and secures the connection between the pin 34 and the corresponding M-slot terminal 18.

As mentioned above, the fourth sub-lead frame 10D is the largest of the sub-lead frames 10A-10G, and includes eight M-slot terminals 18. The M-slot terminals 18 of the fourth sub-lead frame 10D are substantially the same as the M-slot terminals 18 of the other sub-lead frames 10A-10C and 10E-10G, with the exception that the tabs 36 are curved in a second direction, or downwardly as shown in FIGS. 1-4 and 7. The tabs 36 of the M-slot terminals 18 of the fourth sub-lead frame 10D are angled downwardly to engage with the connector pins (not shown) which are part of the main lead frame of the TCU in a similar manner as the connector pins 34 of the pressure sensors 32.

During assembly, the fourth sub-lead frame 10D and fourth segment 12d are connected to the main lead frame of the TCU first, where the main lead frame of the TCU has connecting features that are disposed in the mounting apertures 28 to connect to the fourth segment 12d, and the main lead frame of the TCU has connector pins that are inserted into the M-slot terminals 18 of fourth sub-lead frame 10D. Once the fourth sub-lead frame 10D and fourth segment 12d are connected to the main lead frame of the TCU, the remaining sub-lead frames 10A-10C, 10E-10G and segments 12a-12c, 12e-12g are then connected to pressure sensors 32 in the same manner as the connection of the first sub-lead frame 10A and first segment 12a to the pressure sensor 32 as shown in FIG. 7. If there are variations in the locations of the pressure sensors 32, then the interconnects 14a1-14f4 are able to deflect, allowing the sub-lead frames 10A-10C, 10E-10G to move, and therefore compensate for the variations in these locations, and the remaining sub-lead frames 10A-10C, 10E-10G and segments 12a-12c, 12e-12g are then connected to the other pressure sensors 32.

The sub-lead frames 10A-10G being connected through the use of the interconnects 14 provides the functionality of compensating for component location tolerances, where the variation in the location of the pressure sensors 32 may be caused by thermal expansion, variation in the dimensions of the pressure sensors 32 occurring during the manufacturing process, or the like. The variations in component location may cause difficulty in connecting the components to the terminals 18 of each of the sub-lead frames 10A-10G if there was nothing to compensate for these variations. The interconnects 14 allow for movement between the sub-lead frames 10A-10G, which therefore provides the functionality of allowing the electrical components, such as the pressure sensors 32, to have variations in their respective locations, and still be connected to the lead frame assembly 10. In one embodiment, the interconnects 14 are stamped components, but it is within the scope of the invention that other manufacturing processes may be used.

The lead frame assembly 10 also includes several carrier brackets 20, which provide rigidity to the lead frame assembly 10 when the lead frame assembly 10 is transported from one location to the next during the manufacturing process. When the carrier brackets 20 are connected to the segments 12a-12g, the lead frames 10A-10G are prevented from moving relative to one another. The rigidity is beneficial during transportation between manufacturing facilities, and within a single manufacturing facility.

Once the carrier brackets 20 are removed, the various electrical components are connected to the lead frame assembly 10, and the interconnects 14 allow for flexible movement between the sub-lead frames 10A-100, to provide the ability to connect to different components, such as the pressure sensors 32, as described above.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
   a lead frame assembly, including:
   a plurality of sub-lead frames;
   a plurality of interconnects which connect each of the plurality of sub-lead frames;
   a plurality of terminals, each one of the plurality of terminals connected to one of the plurality of sub-lead frames;
   a plurality of segments, each one of the plurality of segments surrounding a corresponding one of the plurality of sub-lead frames;
   each one of the plurality of interconnects further comprising:
      a first arc portion connected to one of the plurality of segments;
      a second arc portion connected to the first arc portion; and
      a third arc portion connected to the second arc portion and another of the plurality of segments;
   wherein the plurality of interconnects allows for relative movement between each of the plurality of sub-lead frames, and the first arc portion, second arc portion, and third arc portion flex to allow for relative movement between two or more of the plurality of segments.

2. The apparatus of claim 1, the plurality of terminals further comprising at least one slot terminal integrally formed with one of the plurality of segments, wherein one or more electrical components are connected to the at least one slot terminal.

3. The apparatus of claim 1, further comprising:
   a main lead frame being part of a transmission control unit; and
   a plurality of sensors;
   wherein one of the plurality of sub-lead frames is connected to the main lead frame, and each of the plurality of sensors is connected to one of the other of the plurality of sub-lead frames, such that the main lead frame is in electrical communication with one or more of the plurality of sensors.

4. The apparatus of claim 1, the plurality of sub-lead frames further comprising:
   a first sub-lead frame; and
   a second sub-lead frame connected to the first sub-lead frame with one or more of the plurality of interconnects;
   wherein the first sub-lead frame is able to move transversely relative to the second sub-lead frame.

5. The apparatus of claim 4, the plurality of sub-lead frames further comprising:
   a third sub-lead frame connected to the second sub-lead frame with one or more of the plurality of interconnects; and
   a fourth sub-lead frame connected to the third sub-lead frame with one or more of the plurality of interconnects;
   wherein the third sub-lead frame is able to move transversely relative to the second lead frame and the fourth lead frame.

6. The apparatus of claim 5, the plurality of sub-lead frames further comprising:
   a fifth sub-lead frame connected to the fourth sub-lead frame with one or more of the plurality of interconnects;
   a sixth sub-lead frame connected to the fifth sub-lead frame with one or more of the plurality of interconnects; and
   a seventh sub-lead frame connected to the sixth sub-lead frame with one or more of the plurality of interconnects;
   wherein the fifth sub-lead frame is able to move transversely relative to the fourth sub-lead frame, and the fifth sub-lead frame, the sixth sub-lead frame, and the seventh sub-lead frame are able to move transversely to one another.

7. The apparatus of claim 1, wherein two or more of the plurality of interconnects connect one of the plurality of sub-lead frames to another of the plurality of sub-lead frames, such that one or more of the plurality of interconnects is offset from at least another of the plurality of interconnects, allowing the plurality of terminals to be configured for attachment to various components.

8. A lead frame assembly, comprising:
   a plurality of sub-lead frames;
   a first sub-lead frame, the first sub-lead frame being one of the plurality of sub-lead frames;
   a second sub-lead frame, the second sub-lead frame being one of the plurality of sub-lead frames;
   a plurality of segments, each one of the plurality of segments molded around a corresponding one of the plurality of sub-lead frames;
   a plurality of interconnects, each one of the plurality of interconnects connected to one or more of the plurality of sub-lead frames; and
   a plurality of terminals, each of the plurality of terminals connected to one of the plurality of sub-lead frames;
   wherein the plurality of interconnects provide for movement of each of the plurality of sub-lead frames relative to one another, and for electrical communication between the plurality of sub-lead frames, the first sub-lead frame is connected to the second sub-lead frame using one or more of the plurality of interconnects, and one or more of the plurality of terminals are connected to the first sub-lead frame or the second sub-lead frame, and at least two of the plurality of interconnects provide a connection between the first sub-lead frame and the second sub-lead frame, allowing the first sub-lead frame to move transversely relative to the second sub-lead frame.

9. The lead frame assembly of claim 8, further comprising:
a third sub-lead frame connected to the second sub-lead frame using one or more of the plurality of interconnects;
a fourth sub-lead frame connected to the third sub-lead frame using one or more of the plurality of interconnects;
a fifth sub-lead frame connected to the fourth sub-lead frame using one or more of the plurality of interconnects;
a sixth sub-lead frame connected to the fifth sub-lead frame using one or more of the plurality of interconnects; and
a seventh sub-lead frame connected to the sixth sub-lead frame using one or more of the plurality of interconnects;
wherein the third sub-lead frame is able to move transversely relative to the second sub-lead frame, the fourth sub-lead frame is able to move transversely relative to the third sub-lead frame, the fifth sub-lead frame is able to move transversely relative to the fourth sub-lead frame, the sixth sub-lead frame is able to move transversely relative to the fifth sub-lead frame, and the seventh sub-lead frame is able to move transversely relative to the sixth sub-lead frame, allowing the lead frame assembly to compensate for variations in dimensions of components connected to each of the plurality of terminals.

10. The lead frame assembly of claim 9, further comprising:
a main lead frame that is part of a transmission control unit; and
a plurality of sensors;
wherein the fourth sub-lead frame is connected to the main lead frame, and each of the plurality of sensors is connected to one of the plurality of terminals which are part of one of the first sub-lead frame, the second sub-lead frame, the third sub-lead frame, the fifth sub-lead frame, the sixth sub-lead frame, or the seventh sub-lead frame, such that the main lead frame is in electrical communication with one or more of the plurality of sensors.

11. The lead frame assembly of claim 8, each of the plurality of interconnects further comprising:
a first arc portion being part of one of the sub-lead frames;
a second arc portion connected to the first arc portion; and
a third arc portion being part of another of the plurality of sub-lead frames and connected to the second arc portion;
wherein the first arc portion and second arc portion are able to deflect relative to one another, and the second arc portion and third arc portion are able to deflect relative to one another, such that the each of the sub-lead frames are able to move transversely relative to one another.

12. The lead frame assembly of claim 8, wherein two or more of the plurality of interconnects connecting one of the plurality of sub-lead frames to another of the plurality of sub-lead frames, such that one or more of the plurality of interconnects is offset from at least another of the plurality of interconnects, controlling the transverse movement of the plurality of sub-lead frames relative to one another.

13. The lead frame assembly of claim 8, each of the plurality of terminals further comprising a plurality of M-slot terminals.

14. A lead frame assembly having flexible interconnects, comprising:
a first sub-lead frame having a first segment molded around the first sub-lead frame;
a second sub-lead frame having a second segment molded around the second sub-lead frame;
a third sub-lead frame having a third segment molded around the third sub-lead frame;
a fourth sub-lead frame having a fourth segment molded around the fourth sub-lead frame;
a fifth sub-lead frame having a fifth segment molded around the fifth sub-lead frame;
a sixth sub-lead frame having a sixth segment molded around the sixth sub-lead frame;
a seventh sub-lead frame having a seventh segment molded around the seventh sub-lead frame;
a plurality of interconnects integrally formed with one or more of the first sub-lead frame, the second sub-lead frame, the third sub-lead frame, the fourth sub-lead frame, the fifth sub-lead frame, the sixth sub-lead frame, and the seventh sub-lead frame, such that a portion of the plurality of interconnects provide a connection between the first sub-lead frame and the second sub-lead frame, a connection between the second sub-lead frame and the third sub-lead frame, a connection between the third sub-lead frame and the fourth sub-lead frame, a connection between the fourth sub-lead frame and the fifth sub-lead frame, a connection between the fifth sub-lead frame and the sixth sub-lead frame, and a connection between the sixth sub-lead frame and the seventh sub-lead frame;
a plurality of terminals being part of each of the first sub-lead frame, the second sub-lead frame, the third sub-lead frame, the fourth sub-lead frame, the fifth sub-lead frame, the sixth sub-lead frame, and the seventh sub-lead frame;
a first arc portion being part of one of the first sub-lead frame, the second sub-lead frame, the third sub-lead frame, the fourth sub-lead frame, the fifth sub-lead frame, the sixth sub-lead frame, of the seventh sub-lead frame, the first arc portion being part of one of the plurality of interconnects;
a second arc portion connected to the first arc portion, the second arc portion being part of one of the plurality of interconnects; and
a third arc portion connected to the second arc portion, and the third arc portion being part of one of the first sub-lead frame, the second sub-lead frame, the third sub-lead frame, the fourth sub-lead frame, the fifth sub-lead frame, the sixth sub-lead frame, or the seventh sub-lead frame, the third arc portion being part of one of the plurality of interconnects;
wherein the plurality of interconnects allow for relative movement and electrical communication between the first sub-lead frame and the second sub-lead frame, between the second sub-lead frame and the third sub-lead frame, between the third sub-lead frame and the fourth sub-lead frame, between the fourth sub-lead frame and the fifth sub-lead frame, between the fifth sub-lead frame and the sixth sub-lead frame, and between the sixth sub-lead frame and the seventh sub-lead frame, such that various components may be attached to one or more of the plurality of terminals, and be in electrical communication with each other, and the first arc portion, the second arc portion, and the third arc portion are flexible to allow relative movement between the first sub-lead frame and the second sub-lead frame, between the second sub-lead frame and the third sub-lead frame, between the third sub-lead frame and the fourth sub-lead frame, between the fourth sub-lead frame and the fifth sub-lead frame, between the fifth sub-lead frame and the sixth sub-lead frame, and between the sixth sub-lead frame and the seventh sub-lead frame.

15. The lead frame assembly having flexible interconnects of claim 14, each of the plurality of terminals further comprising a plurality of M-slot terminals.

16. The lead frame assembly having flexible interconnects of claim 14, further comprising:
   a main lead frame that is part of a transmission control unit; and
   a plurality of sensors;
   wherein the fourth sub-lead frame is connected to the main lead frame, and each of the plurality of sensors is connected to one of the plurality of terminals which are part of one of the first sub-lead frame, the second sub-lead frame, the third sub-lead frame, the fifth sub-lead frame, the sixth sub-lead frame, or the seventh sub-lead frame, such that the main lead frame is in electrical communication with one or more of the plurality of sensors, through the plurality of sub-lead frames.

17. The lead frame assembly having flexible interconnects of claim 14, wherein one or more of the plurality of interconnects is positioned such that the plurality of terminals are configured for attachment to various components.

* * * * *